United States Patent [19]
Mandal et al.

[11] Patent Number: 5,954,878
[45] Date of Patent: Sep. 21, 1999

[54] APPARATUS FOR UNIFORMLY COATING A SUBSTRATE

[75] Inventors: Robert P. Mandal, Saratoga; James C. Grambow, San Jose; Ted C. Bettes, Newark; Donald R. Sauer, San Jose; Emir Guegrer, Sunnyvale; Edmond R. Ward, Monte Sereno, all of Calif.

[73] Assignee: Silicon Valley Group, Inc., San Jose, Calif.

[21] Appl. No.: 08/876,273

[22] Filed: Jun. 16, 1997

Related U.S. Application Data

[60] Division of application No. 08/566,227, Dec. 1, 1995, Pat. No. 5,670,210, which is a continuation-in-part of application No. 08/330,045, Oct. 27, 1994, abandoned.

[51] Int. Cl.⁶ ..................................................... B05B 13/02
[52] U.S. Cl. ............................. 118/319; 118/52; 118/600
[58] Field of Search ........................... 118/52, 320, 319, 118/64, 300, 61, 58, 63, 62, 500, 600, 232

[56] References Cited

U.S. PATENT DOCUMENTS

| | | | |
|---|---|---|---|
| 4,451,507 | 5/1984 | Beltz et al. | 118/52 |
| 5,143,552 | 9/1992 | Moriyama | 118/52 |
| 5,472,502 | 12/1995 | Batchelder | 118/52 |

*Primary Examiner*—David A. Simmons
*Assistant Examiner*—Calvin Padgett
*Attorney, Agent, or Firm*—Wilson, Sonsini, Goodrich & Rosati

[57] ABSTRACT

A method of and an apparatus for coating a substrate with a polymer solution to produce a film of uniform thickness, includes mounting the substrate inside an enclosed housing and passing a control gas, which may be a solvent vapor-bearing gas into the housing through an inlet. The polymer solution is deposited onto the surface of the substrate in the housing and the substrate is then spun. The control gas and any solvent vapour and particulate contaminants suspended in the control gas are exhausted from the housing through an outlet and the solvent vapor concentration is controlled by controlling the temperature of the housing and the solvent from which the solvent vapor-bearing gas is produced. Instead the concentration can be controlled by mixing gases having different solvent concentrations. The humidity of the gas may also be controlled.

3 Claims, 2 Drawing Sheets

APPARATUS FOR UNIFORMLY COATING A SUBSTRATE

CROSS REFERENCE TO RELATED APPLICATIONS

This application is a division of application Ser. No. 08/566,227 filed Dec. 1, 1995 which application is now U.S. Pat. No. 5,670,210 which is a continuation-in-part of Ser. No. 08/330,045, filed Oct. 27, 1994, now abandoned.

BACKGROUND OF THE INVENTION

The manufacture of integrated circuits involves the transfer of geometric shapes on a mask to the surface of a semiconductor wafer. Thereafter the semiconductor wafer corresponding to the geometric shapes or corresponding to the areas between the geometric shapes is etched away. The transfer of the shapes from the mask to the semiconductor wafer typically involves a lithographic process. This includes applying a photosensitive pre-polymer solution to the semiconductor wafer. The solvent in the pre-polymer solution is removed by evaporation, and the resulting polymer film is then baked. The film is exposed to radiation, for example ultraviolet light, through a photomask supporting the desired geometric patterns. The images in the photosensitive material are then developed by soaking the wafer in a developing solution. The exposed or unexposed areas are removed in the developing process, depending on the nature of the photosensitive material. Thereafter the wafer is placed in an etching solution which etches away the areas not protected by the photosensitive material. Due to their resistance to the etching process, the photosensitive materials are also known as photoresists. These may for instance be sensitive to ultraviolet light, electron beams, x-rays, or ion beams.

The high cost of the photoresist pre-polymer solutions makes it desirable to devise methods of improving the efficiency of the coating process so as to minimize the polymer solution's consumption. Furthermore, thickness uniformity of the photoresist layer is an important criterion in the manufacture of integrated circuits. It ensures satisfactory reproduction of the geometric patterns on the semiconductor wafer.

The solvent in the photoresist tends to evaporate during application, increasing the viscosity of the polymer solution and inhibiting the leveling of the resulting film. This produces thickness non-uniformities. It is therefore desirable to be able to control the rate of evaporation of solvent from the polymer solution.

Environmental humidity is one of the factors affecting the thickness of the photoresist layer. Typically photoresist coating uniformity of the order of 15 to 20 angstroms within a wafer and 20 to 25 angstroms from one wafer to the next and from batch to batch and from day to day is required. This is less than the effect of a 1% difference in relative humidity. Furthermore, in commonly used positive photoresists employing photosensitive diazoquinone compounds, some water content is required to react with products of the photolytic reaction to form required water-soluble carboxylic acids.

OBJECTS AND SUMMARY OF THE INVENTION

It is an object of the invention to provide a method of and an apparatus for improving the thickness uniformity of a polymer solution applied to a surface of a substrate such as a semiconductor wafer.

It is a further object of the invention to improve the consumption of polymer solutions such as photoresist prepolymer solutions used in the coating of substrates.

According to the invention there is provided a method of coating a surface of a substrate with a polymer solution which includes mounting the substrate inside an enclosed housing, passing a control gas into the housing through an inlet, depositing the polymer solution onto the surface of the substrate in the housing, spinning the substrate, and exhausting the control gas and any solvent vapour and particulate contaminants suspended in the control gas from the housing through an outlet.

The control gas can be a solvent vapour-bearing gas or a solvent-free gas.

The step of exhausting the control gas and any solvent vapour and contaminants can be performed before, during, or after the deposition step.

The solvent vapor-bearing gas is typically produced by bubbling a gas through a solvent and can include the step of controlling the solvent vapor concentration of the solvent vapor-bearing gas by controlling the temperature of the solvent. The solvent vapor concentration of the solvent vapor-bearing gas can also be controlled by controlling the temperature of the housing or by mixing the solvent vapor-bearing gas with a second gas having a different solvent vapor concentration.

The solvent vapor-bearing gas typically comprises air or an inert gas such as nitrogen.

The control gas can be passed into the housing through a showerhead dispenser located directly above the substrate to ensure continuous, controlled, laminar gas flow over the wafer.

The polymer solution can contain a photoresist polymer, for example, a deep-ultraviolet photoresist polymer.

The method can include the step of passing temperature controlled solvent-free, dry, filtered gas over the coated substrate. The method can also include the step of passing solvent-free, humid gas over the coated substrate; the humidity of the humid gas can be controlled to have the relative humidity required by the polymer solution. The relative humidity lies typically in the range of 40% to 45%. The temperature of the humid gas can also be controlled by means of a temperature and humidity controller.

The step of mounting the substrate in the housing can include securing the substrate to a rotatable chuck, for example, by establishing a vacuum between the substrate and the chuck.

The substrate typically comprises a semiconductor wafer and the solute content in the polymer solution is typically 10% to 50% by weight.

Further, according to the invention there is provided a coating apparatus for coating a surface of a substrate with a polymer solution which includes an enclosed housing, a rotatable chuck mounted in the housing for supporting the substrate, a depositing means for depositing the polymer solution onto the surface of the substrate in the housing, a control gas supply means connected in flow communication with the housing for supplying a control gas to the housing, and an exhaust means connected to the housing for exhausting the control gas and any solvent vapour and particulate contaminants from the housing.

The depositing means can include a dispensing head means mounted above the chuck for dispensing a stream of the polymer solution onto the surface of the substrate, the dispensing head means being moveable relative to the substrate. If the substrate has a substantially circular shape, the dispensing head means is typically moveable substantially radially across the surface of the substrate. The depositing means can instead comprise a film extruding means having an extrusion head mounted above the chuck for dispensing a stream of the polymer solution onto the surface of the substrate. In this case, if the substrate is substantially circular in shape, the extrusion head is typically mounted above the chuck for dispensing a radially extending stream of the polymer solution onto the surface of the substrate.

The rotatable chuck is typically connected to a variable speed motor, and the coating apparatus can include a controlling means for controlling the speed of the variable speed motor.

The housing can have an upstream side and a downstream side; the solvent vapor-bearing gas supply means can include an inlet to the housing mounted at the upstream side of the housing, and the exhaust means can include an outlet mounted at the downstream side of the housing. The control gas supply means can include conduits connected in flow communication with the housing, and electrically-controlled valves in at least one of the conduits for controlling the rate of control gas flowing into the housing and the composition of the control gas. The exhaust means can also include a valve means for controlling the exhaustion of the gas and any contaminants from the housing. The solvent vapor-bearing gas supply means can include a clean, dry, filtered gas source and a bubbler connected in flow communication with the housing.

The coating apparatus can, further, include a temperature and humidity controlled gas source connected in flow communication with the housing. The temperature and humidity controlled gas source can include a temperature control means and humidity control means for controlling the temperature and humidity of the gas supplied by the temperature and humidity controlled gas source.

DETAILED DESCRIPTION OF THE INVENTION

Figure 1:
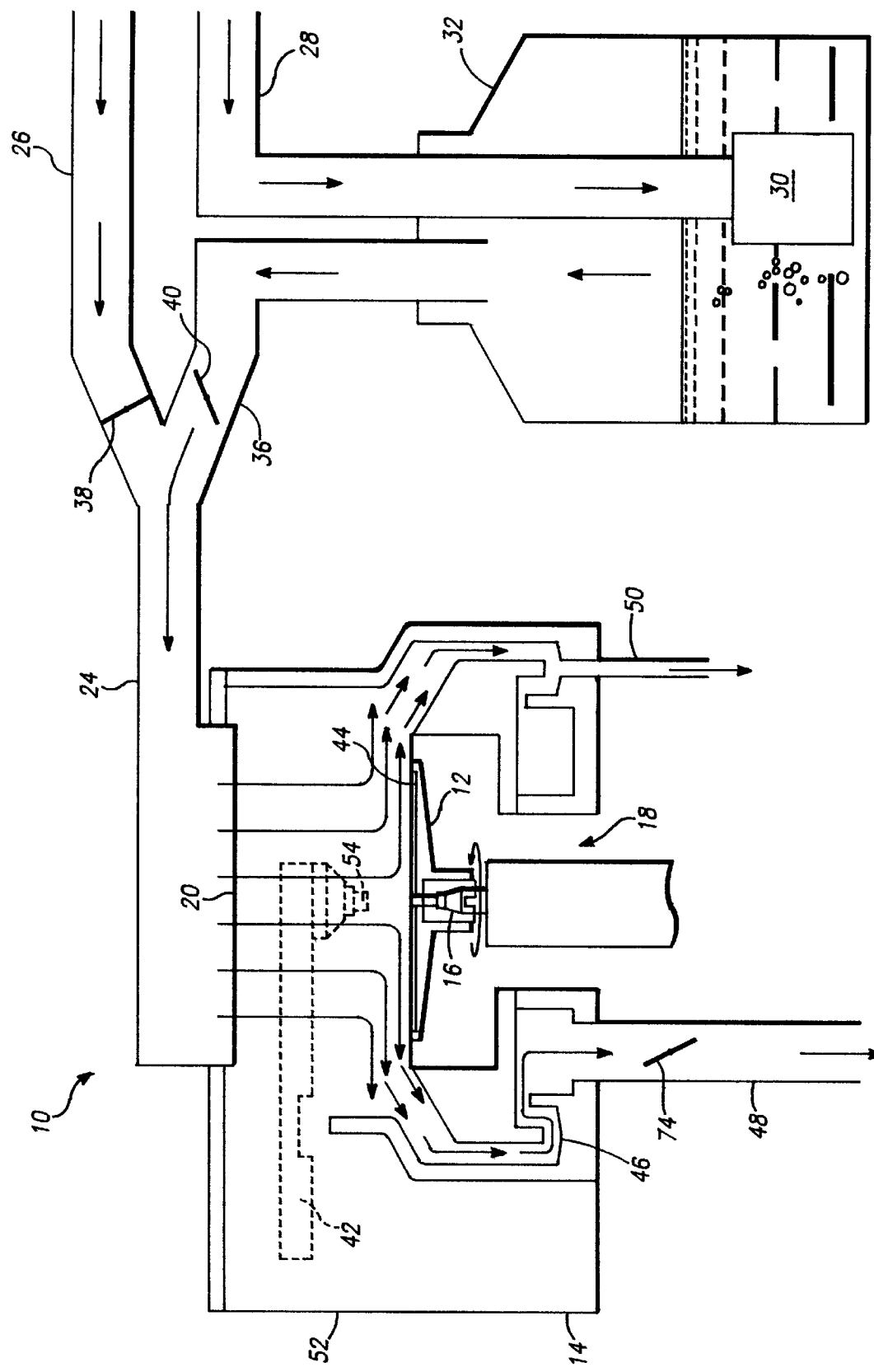
FIG. 1 shows a schematic sectional side view of one embodiment of a spin coating arrangement in accordance with the invention.

This invention pertains to a method of improving the thickness uniformity of coatings formed when depositing solutions on substrates. It pertains further to a method of reducing the wastage of such solutions. In particular, the method will be described with reference to semiconductor wafers used in the manufacture of integrated circuits and the application of photoresist pre-polymer solutions to a surface of a semiconductor wafer. It will be appreciated that films or coatings used in integrated circuit manufacture are not limited to photoresist layers and could, for example, include materials such as organic planarization films, anti-reflection films, siloxane spin-on-glass films, polyimide films, and polyimide siloxane films.

As mentioned above the solute content in these materials prior to the coating process typically ranges from 10% to 50% by weight.

As will become clearer from the discussion which follows below it is desirable to conduct the coating process of the semiconductor wafer in a housing or chamber which allows the atmosphere in the chamber to be at least partially saturated with solvent molecules. This has the advantage of improving the cast film wetability by establishing a monolayer coating of solvent on the surfaces of the substrate. Furthermore by controlling the concentration of solvent in the gas within the chamber, thickness uniformity of the polymer solution film on the substrate can be improved. This will be the case whether spin-cast films, spray-coated films or any other similar coating method is adopted.

In a spin-cast method, a solution is applied to the substrate while the substrate is either stationary, moving linearly, or rotating. Thereafter the substrate is spun to spread the solution over the surface of the substrate. After the solution has spread over the substrate surface, the solvent in the solution is removed by evaporation leaving a layer of solute on the surface of the substrate. As substrate sizes are increased or when attempts are made to reduce costs by minimizing the amount of fluid applied to the surface of the substrate, a non-uniform thickness in the solute layer on the substrate typically results. This is, in part, a result of the difference in tangential velocity between the periphery and the center of the substrate. The non-uniform air flow along the periphery causes non-uniform evaporation of solvent, thereby producing coating thickness non-uniformities. Since the larger substrates require higher spin speeds to obtain uniformity near the center, spirals and striations result near the periphery of the substrate due to non-uniform interaction with the air in contact with the solution near the periphery. These features are known as Ekman spirals.

Problems are also encountered when insufficient coating solution is used. When attempts are made to reduce costs by minimizing the amount of the coating solution applied to the surface of the substrate during spin-casting, non-uniformities are created due to the low solvent volume. Evaporation of the solvent during the coating process results in various defects and irregularities. Similarly, in spray-coated films, solvent tends to evaporate during the application, thus increasing viscosity and inhibiting the levelling of the resulting film, again resulting in thickness non-uniformities.

As mentioned above, certain photoresists require some water content to react with products of the photolytic reaction. For these reasons, it is desirable to be able to control the humidity of the air in the chamber.

The invention will now be described in greater detail with respect to embodiments making use of a spin-coating process. In these embodiments the substrate is a semiconductor wafer and the solution applied to the semiconductor wafer is a photoresist pre-polymer solution.

FIG. 1 shows an embodiment of a spin-coating arrangement 10 used in accordance with the method of the invention. The arrangement 10 includes a rotatable support chuck 12 mounted in an enclosed housing 14. The chuck 12 extends into an axle 16 which passes through an opening 18 in the housing 14. The housing 14 includes an input in the form of a shower-head-like dispenser 20. This allows control gas, comprising a gas and a certain concentration of solvent to be passed into the housing 14. The control gas can be a solvent-free gas or a solvent-bearing gas and can include air or an inert gas such as nitrogen. The dispenser 20 is mounted directly above the substrate that is mounted on the chuck 12. An input conduit 24 extends into the shower-head-like dispenser 20 at its one end. A temperature and humidity controlled gas source (not shown) supplying temperature and humidity controlled air or nitrogen is connected to the conduit 24 by means of a conduit 26. A second conduit 28 extends from a clean, dry, filtered gas source into a bubbler 30. The bubbler 30 is housed in a solvent tank 32 containing a solvent 34. The clean, dry, filtered gas, which typically comprises air or nitrogen, is passed through the bubbler 30 to form a solvent-bearing gas which is channelled to the conduit 24 by means of a conduit 36. A valve 38 is mounted in the conduit 26 and a valve 40 is mounted in the conduit 36. The valves 38, 40 allow either one or both the temperature and humidity controlled gas and the solvent-bearing gas to be channelled to the housing 14. The valves 38, 40 are typically electrically-controlled valves for automated control of gas flow rates and compositions. The temperature of the solvent-bearing gas supplied by the bubbler 30 is controlled by means of heating/cooling coils which control the temperature of the gas supplied by the conduit 28 or of the solution 34 or both. Normally heat must be supplied to the solvent 34 to compensate for heat loss due to evaporation. The temperature and humidity of the temperature and humidity controlled gas are also controlled using a special temperature and humidity controller comprising a refrigeration unit, a boiler, and a temperature and humidity sensor. Instead the temperature and humidity of the temperature and humidity controlled gas can be controlled by means of a temperature and humidity controller employing a bubbler arrangement. In a preferred embodiment the conduit 26 is supplied by two branch conduits (not shown). This allows connection to either a bubbler or a humidity controlled source. The bubbler is typically mounted in an outer housing containing the remainder of the arrangement 10. In contrast the special humidity controller proposed above comprises a separate structure. When humid air is supplied the relative humidity is maintained at a level required by the polymer solution: typically between 40% and 45%. Clearly the humidity can be kept at zero in appropriate circumstances.

The arrangement 10 further includes a dispensing head 42 for dripping a solution (in this case a photoresist pre-polymer solution) onto a wafer 44 mounted on the chuck 12.

The bottom of the housing 14 defines an annular channel 46 having an exhaust 48 for gas such as air or nitrogen, and a drain 50 for liquid.

In a typical process the semiconductor wafer 44 is secured to the chuck 12 using any standard method such as a vacuum established between the chuck 12 and the wafer 44. A wafer transport door 52 to the housing 14 is thereafter closed. The housing 14 is purged with dry solvent-free gas. Control gas is then fed into the housing. The solvent concentration of the control gas can be controlled before, during and after the coating solution is dispensed onto the substrate. By manipulating the valves 38 and 40, the solvent is passed along the conduit 36 through the valve 40, along the conduit 24, and into the housing 14. A controlled partial pressure of solvent can be achieved by bubbling the gas, comprising nitrogen or air, through the bubbler 30. The bubbler 30 in this embodiment includes a porous glass frit from which the gas is passed through the liquid solvent 34 which is maintained at an appropriate set temperature. The resultant solvent-bearing gas, containing the appropriate concentration of solvent, is passed over the semiconductor wafer prior to and during the coating process. Clearly the solvent tank 32 must contain or be supplied with sufficient solvent to allow the desired solvent concentration in the solvent-bearing gas to be maintained.

Figure 2:
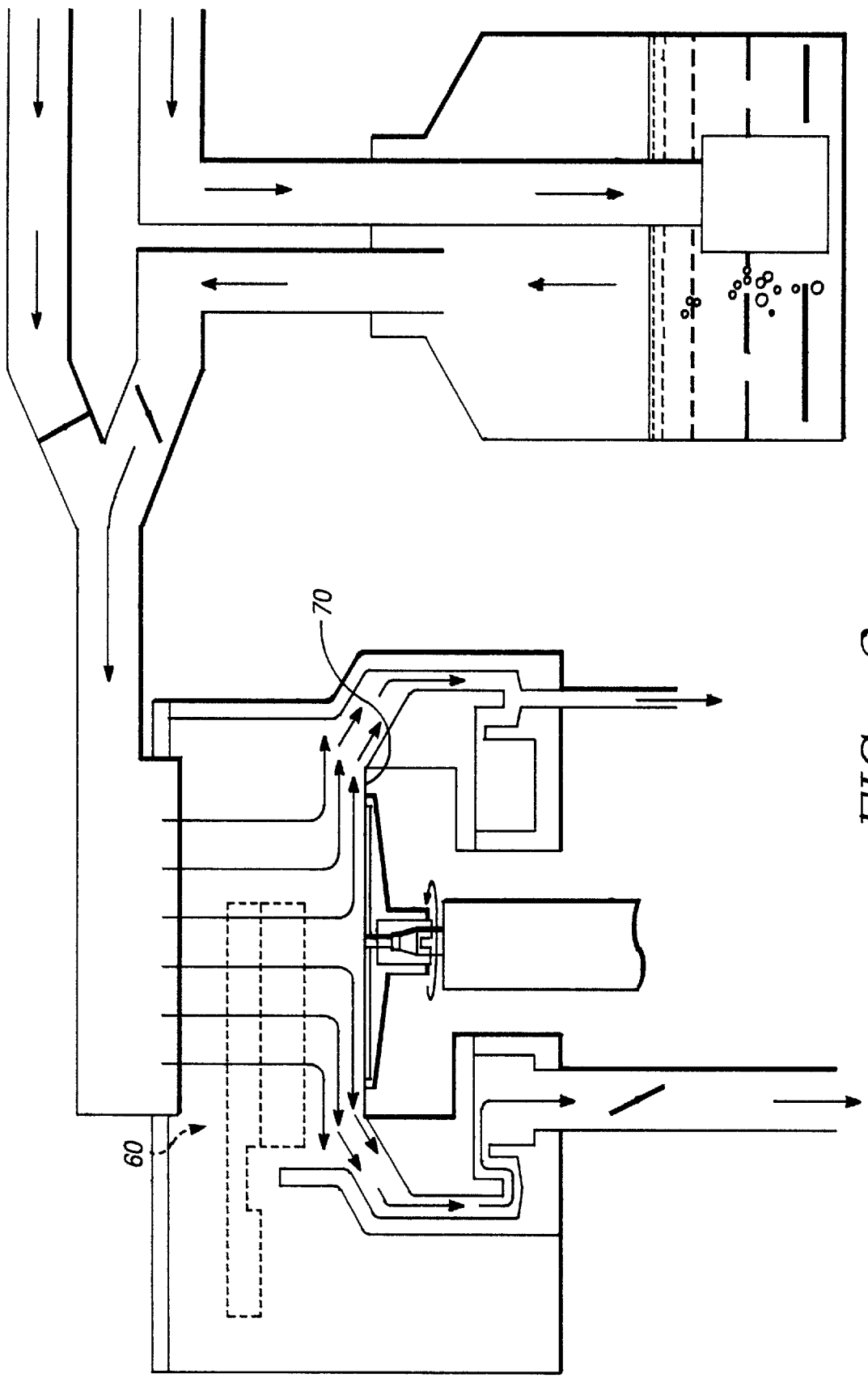
FIG. 2 shows a schematic sectional side view of another embodiment of a spin coating arrangement in accordance with the invention.

In order to deposit a layer of photoresist onto the wafer 44, the polymer solution is applied across the surface of the wafer 44 via the dispensing head 42. This is achieved by dispensing the polymer solution in a continuous stream from a nozzle 54 onto the wafer 44 while the wafer 44 is spinning at relatively low speed or while it is stationary. In the preferred embodiment, the nozzle 54 is moved substantially radially across the wafer 44. Instead, the solution can be dispensed at the center of the substrate, or multiple nozzles can be used. By adjusting the spin speed of the wafer 44, the movement of the nozzle 52 and the rate at which the polymer solution is dispensed, a suitable distribution of the solution can be achieved. In another embodiment, as illustrated in FIG. 2, the polymer solution is deposited onto the wafer by means of a film extruder 60, which is a conventional extruder known in the art, while the wafer is rotated by one full turn. The extruder 60, deposits a film of polymer solution onto the wafer 70. If a wafer not having a substantially circular shape, is to be coated, the wafer is typically moved longitudinally during the polymer solution deposition step.

Since the extruder process is otherwise identical to the FIG. 1 embodiment, the process will be described with reference to FIG. 1. After the solution has been deposited on the wafer 44, the spin speed of the wafer 44 is increased to spread the solution across the upper surface of the wafer 44. By exhausting the solvent-containing gas and any particulate contaminants suspended in the solvent-bearing gas via the exhaust 48, before and during the coating of the wafer 44, a uniform layer of photoresist pre-polymer solution can be formed on the upper surface of the wafer 44. Thereafter the gas passed into the chamber via the conduit 24 is switched to temperature and humidity controlled solvent-free gas such as air or nitrogen by means of the valves 38, 40. The valves 38 and 40 are typically controlled by a microprocessor (not shown). The solvent concentration in the control gas is then decreased or the temperature of the control gas increased to remove more of the solvent in the polymer solution deposited on the wafer 44. Typically, a solvent-free gas is supplied to the housing to enhance the evaporation of the solvent from the polymer solution. When the desired amount of evaporation has taken place to form a sufficiently hard layer of photoresist, the wafer 44 is stopped, the wafer transport door opened, and the coated wafer removed from the housing 14. As mentioned above, gas, which may be dry or humid, solvent-free or solvent-bearing gas, is removed from the housing 1 4 during the various stages via the exhaust 48. In this way the gas is channelled to pass over the wafer 44 from an upstream side at the shower-head dispenser 20 to a downstream side at the exhaust 48. The exhaust flow is controllable by means of a valve 74, thereby allowing the gas pressure in the housing 44 to be controlled. The valve 74 is typically controlled by means of a microprocessor (not shown). Any polymer solution spun off, including particulate contaminants, is collected in the annular channel 46 to be removed via the drain 50.

As discussed above the temperatures of the liquid solvent or gas supplied to the bubbler 30 is adjustable. In this way the partial pressure of solvent in the solvent-bearing gas can be adjusted. This can be achieved by making use of heating/cooling coils as described above. Instead the concentration can be adjusted by adding a gas bearing a different solvent concentration. This could be supplied via a conduit (not shown) connected to the conduit 36. Clearly if the temperatures of the bubbler and the housing 14 are the same, the solvent-bearing gas will be saturated with solvent. If the temperature of the bubbler is higher, the solvent-bearing gas in the housing 14 will be super saturated, and if the temperature of the bubbler is lower, the solvent-bearing gas in the housing 14 will be unsaturated. Typically the solvent-bearing gas supplied by the bubbler 30, and the housing 14 will be kept at the same temperature to maintain solvent saturation. As mentioned above, the arrangement 10 is typically mounted in an outer housing (not shown). The outer housing is temperature controlled to maintain it and the components of the arrangement 10 at a temperature of typically 22° C.

Usually the solvent contained in the bubbler and borne by the gas will be the same as that contained in the solution deposited on the wafer. Similarly, if the solution contains more than one solvent, the bubbler may contain similar solvents in the same ratios. However it may be desirable in certain circumstances to use different solvents in the bubbler as compared to the solvents in the solution deposited on the wafer.

It will be appreciated that a solvent-bearing gas can be produced using techniques other than a bubbler.

Solvent vapor pressure can be determined precisely by using an isoteniscope. Alternatively, by passing inert gas through a sample of the solution and measuring the amount of solvent removed as a function of time gravimetrically, the vapor pressure can be determined precisely. The solvent partial pressure in the gas supplied by the conduit 36 can be adjusted, optimally to correspond to the equilibrium vapor pressure created by the solvent in the polymer solution. This ensures that the rate at which solvent evaporates from the deposited film or coating is equal to the rate at which the solvent is absorbed by the film from the gaseous environment.

As mentioned above the solvent partial pressure in the housing 14 can be adjusted by controlling the temperature of the bubbler or gas. Alternatively, a gas containing a different solvent concentration can be mixed with the solvent-saturated gas. The optimum profile of solvent partial pressure in the housing atmosphere as a function of time during the coating process can be determined empirically.

By continuously exhausting the solvent-bearing gas or humid air via the exhaust 48, humidity and solvent partial pressure in the housing can readily be adjusted during the coating process to ensure a uniform solution layer thickness on the semiconductor wafer surface. Similarly the effects of premature evaporation of solvent from the polymer solution deposited on the wafer 44 can be eliminated. This allows less polymer solution to be used, thereby reducing costs.

Clearly the invention is not limited to the embodiments described above. The conduit 28 could, for instance, be connected directly to the conduit 36. In this way the gas supplied by the temperature and humidity controlled source could also supply the bubbler 30. The humidity of the temperature and humidity controlled source would simply be reduced to zero while supplying the bubbler 30. When dry or moist gas is to be supplied to the housing 14, a valve in the conduit 28 could be closed to insure that no solvent is sucked up the conduit 28.

It should be noted that when certain advanced deep ultra-violet photoresist materials are used, a moisture-free casting environment can be used. Accordingly the humidity of the temperature and humidity controlled gas will be kept at zero.

It will further be appreciated that the invention is not limited in its application to a spin coating arrangement but applies equally to arrangements making use of other solution deposition techniques.

The invention claimed is:

1. A coating apparatus for coating a surface of a substrate with a polymer solution which includes an enclosed housing; a rotatable chuck mounted in the housing for supporting the substrate; a depositing means for depositing the polymer solution onto the surface of the substrate in the housing; a control gas supply means connected in flow communication with the housing for supplying a control gas to the housing, the control gas supply means comprising a control gas supply conduit communicating with the housing by means of an inlet; a solvent-bearing gas supply conduit and solvent-free gas supply conduit communicating with the control gas supply conduit; a gas control valve mounted in the solvent-bearing gas supply conduit and a gas control valve mounted in the solvent-free gas supply conduit for controlling the rate of gas flowing from the solvent-bearing gas supply conduit and from the solvent-free gas supply conduit into the control gas conduit to control the composition of solvent vapor in the control gas; and an exhaust means connected to the housing for exhausting the control gas and any solvent vapor and particulate contaminants from the housing, whereby a desired concentration of solvent vapor in the control gas can be provided to control the evaporation rate of solvent from the polymer solution, the desired concentration of solvent vapor being provided by adjusting a gas control valve in at least one of the solvent-bearing gas supply conduit and solvent-free gas supply conduit to provide a ratio of solvent-bearing gas and solvent-free gas which gives said desired concentration.

2. A coating apparatus of claim 1 wherein at least one of said gas control valves is an electrically-controlled valve.

3. A coating apparatus of claim 1 wherein both of said gas control valves are electrically-controlled valves.

* * * * *

UNITED STATES PATENT AND TRADEMARK OFFICE
CERTIFICATE OF CORRECTION

PATENT NO. : 5,954,878
DATED : September 21, 1999
INVENTOR(S) : Robert F. Mandal, et al.

It is certified that error appears in the above-identified patent and that said Letters Patent is hereby corrected as shown below:

Title Page: [75] Inventors: Robert P. Mandal, Saratoga; James C. Grambow, San Jose; Ted C. Bettes, Newark; Donald R. Sauer, San Jose; Emir Gurer, Sunnyvale; Edmond R. Ward, Monte Sereno, all of Calif.

Signed and Sealed this

Twenty-eighth Day of March, 2000

Attest:

Q. TODD DICKINSON

*Attesting Officer*     *Commissioner of Patents and Trademarks*